(12) United States Patent
Rowell et al.

(10) Patent No.: US 11,152,712 B2
(45) Date of Patent: Oct. 19, 2021

(54) ANTENNA SYSTEM AND COMPACT ANTENNA TEST RANGE

(71) Applicant: Rohde & Schwarz GmbH & Co. KG, Munich (DE)

(72) Inventors: Corbett Rowell, Munich (DE); Adam Tankielun, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 0 days.

(21) Appl. No.: 16/829,764

(22) Filed: Mar. 25, 2020

(65) Prior Publication Data
US 2020/0321706 A1    Oct. 8, 2020

(30) Foreign Application Priority Data
Apr. 4, 2019 (EP) .................................... 19167364

(51) Int. Cl.
| | |
|---|---|
| *H01Q 19/06* | (2006.01) |
| *G01R 29/10* | (2006.01) |
| *H01Q 13/02* | (2006.01) |
| *H01Q 13/08* | (2006.01) |
| *G01R 29/08* | (2006.01) |

(52) U.S. Cl.
CPC ....... *H01Q 19/062* (2013.01); *G01R 29/0878* (2013.01); *G01R 29/10* (2013.01); *H01Q 13/02* (2013.01); *H01Q 13/085* (2013.01)

(58) Field of Classification Search
CPC .... H01Q 19/062; H01Q 13/02; H01Q 13/085; H01Q 19/09; H01Q 15/08; H01Q 13/0275; H01Q 1/22; H01Q 1/36; G01R 29/10; G01R 29/0878
See application file for complete search history.

(56) References Cited

U.S. PATENT DOCUMENTS

| | | | |
|---|---|---|---|
| 5,859,615 A | 1/1999 | Toland et al. | |
| 6,317,094 B1* | 11/2001 | Wu | H01Q 13/085 343/767 |
| 7,148,885 B2* | 12/2006 | Nose | G09G 3/3614 345/209 |
| 9,991,591 B1* | 6/2018 | Rowell | H01Q 1/125 |
| 10,082,530 B1* | 9/2018 | Wu | G01R 29/10 |
| 10,608,343 B2* | 3/2020 | Tankielun | H01Q 19/09 |
| 2007/0152898 A1* | 7/2007 | Mizuno | H01Q 13/085 343/767 |

(Continued)

OTHER PUBLICATIONS

Fan, J., et al., "Design of Wideband Quad-Ridged Waveguide Orthomode Transducer at L-Band," Progress in Electromagnetics Research C, 72:115-122, Jan. 2017.

*Primary Examiner* — Vibol Tan
(74) *Attorney, Agent, or Firm* — Christensen O'Connor Johnson Kindness PLLC

(57) ABSTRACT

An antenna system comprises a wide-band antenna and a lens body. At least a portion of the antenna is placed inside the lens body. The antenna has at least two antenna portions with ends. The antenna portions define a distance between them, which gradually increases towards the ends defining the aperture of the antenna. The lens body has at least two curved sections that merge into a common material section of the lens body. The common material section is located below the aperture of the antenna. Further, a compact antenna test range is described.

18 Claims, 2 Drawing Sheets

(56) References Cited

U.S. PATENT DOCUMENTS

| | | | |
|---|---|---|---|
| 2013/0082889 A1* | 4/2013 | Le Bars | H01Q 19/065 |
| | | | 343/753 |
| 2014/0132466 A1* | 5/2014 | Inoue | H01Q 13/085 |
| | | | 343/767 |
| 2018/0166786 A1 | 6/2018 | Kozyrev | |
| 2019/0081408 A1 | 3/2019 | Tankielun et al. | |
| 2020/0067202 A1* | 2/2020 | Rowell | H01Q 25/001 |

* cited by examiner

ANTENNA SYSTEM AND COMPACT ANTENNA TEST RANGE

TECHNICAL FIELD

The present disclosure relates to an antenna system. Further, the present disclosure relates to a compact antenna test range (CATR).

BACKGROUND

Compact antenna test ranges (CATRs) are known in the state of the art. They typically comprise a feed antenna and a reflector assigned to the feed antenna. Ideally, the feed antenna used should have a large half power beam width (HPBW) to properly illuminate the reflector when transmitting electromagnetic signals.

Traditionally, the feed antennas are established by axial choke horn antennas with a waveguide feed wherein the waveguide feed is band-limited due to waveguide physics. In fact, there is a cut-off frequency at the low frequency and higher-order modes at the high frequency. Thus, existing feed antennas as well as compact antenna test ranges having these feed antennas are limited to signals with frequencies in the range of 23 to 43 GHz.

However, for modern communication standards such as new radio or rather 5G, it is necessary to process signals that have frequencies up to 87 GHz.

In the state of the art, antennas are known that can be used as feed antennas for the compact antenna test range, which can process, particularly transmit, signals with higher frequencies than 43 GHz. However, the antennas known so far have a relative low half power beam width, which results in a quiet zone being 50% smaller compared to the one of an axial choke horn antenna.

Thus, compact antenna test ranges have to deal with a tradeoff between the frequency to be processed and the respective half power beam width that affects the size of the usable quiet zone.

SUMMARY

Accordingly, there is a need for an antenna system as well as a compact antenna test range that ensure to use signals with high frequency and large half power beam width.

The present disclosure provides an antenna system comprising, for example, a wide-band antenna and a lens body, wherein at least a portion of the antenna is placed inside the lens body, wherein the antenna has at least two antenna portions with ends, wherein the antenna portions define a distance between them, wherein the distance gradually increases towards the ends defining the aperture of the antenna, wherein the lens body has at least two curved sections that merge into a common material section of the lens body, and wherein the common material section is located below the aperture of the antenna.

The present disclosure is based on the finding that a de-focusing lens can be used for the wide-band antenna in order to ensure that signals with frequencies up to 87 GHz can be transmitted while simultaneously providing a large half power beam width (HPBW).

The de-focusing effect of the lens is provided by the shape of the lens body that has two curved sections merging into the common material section of the lens body while the aperture of the antenna is located above the common material section. Put another way, the antenna portions extend through the common material section, as their respective ends defining the aperture of the antenna are located above the common material section.

The distance between the antenna portions is provided between surfaces of the antenna portions facing each other. Hence, the antenna portions are located opposite to each other while defining a slot or rather a room/space between the at least two antenna portions.

The antenna portions relate to the portions of the antenna that are used for guiding the electromagnetic wave(s), namely the signal. In some embodiments, a signal to be emitted is guided by the antenna portions towards their respective ends. Hence, the ends of the antenna portions are orientated towards the radiation direction of the antenna, namely the direction the electromagnetic waves are emitted. A signal to be received is received via the ends, namely the aperture.

In some embodiments, the ends relate to free ends of the antenna.

The antenna portions may be formed (substantially) symmetrical. In some embodiments, the surfaces of the antenna portions facing each other have the same shape. However, the antenna portions are mirrored with respect to each along an axis extending between both antenna portions, for example in the middle and in the same plane.

The curved sections are located on opposite sides with respect to the common material section. Hence, the curved sections merge into the common material section from opposite sides.

The common material section provides a continuous material portion of the lens body in a cross-section perpendicular to the axial direction of the lens body. The axial direction (substantially) coincides with the propagation direction of the electromagnetic waves emitted.

The continuous material portion has, in axial direction of the lens body, an upper limit and a lower limit, wherein the plane defined by the aperture is located between these limits.

The wide-band antenna is configured, for example, to process signals with frequency up to 87 GHz.

The common material section is located below the aperture of the antenna with respect to the radiation direction of electromagnetic waves provided by the antenna. Put differently, the common material section is located underneath the aperture when viewing on the aperture of the antenna.

According to an aspect, the common material section corresponds to a lens center. The lens center may be different to the geometrical center of the lens body. Hence, the lens center simply relates to the common material section with which all sections of the lens body are connected or rather into which all section of the lens body merge. In other words, the lens center may relate to the main portion of the lens body. However, in case of a rotationally symmetric lens body, the lens center may be equal to the geometrical center of the lens body.

According to another aspect, the common material section is located in the area of the phase center of the antenna. The phase center, in antenna design theory, is the point from which the electromagnetic waves transmitted spread spherically outward, with a phase of the respective signal being equal at any point on the sphere. This respective point, namely the phase center of the antenna, is typically located between the antenna portions. In the specific design provided, the phase center of the antenna is located below the aperture of the antenna, as the phase center of the antenna is provided in the common material section located below the aperture.

As mentioned above, the continuous material portion has, in axial direction of the lens body, an upper limit and a lower limit, wherein the phase center is located between these limits.

Another aspect provides that at least one of both curved sections, for example each of both curved sections, is funnel-shaped. Thus, the lens body has an upper side and a lower side which both comprise the funnel-shaped curved sections that are orientated towards a center of the lens body, for example the common material section. The funnel-shaped curved sections do not merge with each other. Thus, a, for example continuous, opening is not provided, as both funnel-shaped sections end at the common material section of the lens body. In other words, the lens body closes or rather seals the funnel(s) provided by the funnel-shaped curved section(s).

In general, the funnel relates to a space that has the shape of a truncated cone or rather a frustum of a cone.

Furthermore, the aperture of the antenna may define a plane that intersects one of both curved sections, in particular wherein the plane intersects the funnel provided by the funnel-shaped curved section. The plane provided by the aperture of the antenna is (substantially) perpendicular to the orientation of the antenna portions. Since the aperture is defined by the ends of the antenna portions, the respective plane is also defined by the ends.

The aperture provided between the ends may be located partly in the funnel, namely the recess or rather opening provided by the shape of the lens body, as the respective antenna portions, for example their ends, are located inside the lens body.

The curved sections may generally correspond to curved depressions in sides of the lens body. In some embodiments, the curved sections are located at opposite sides of the lens body, namely the upper side and the lower side of the lens body.

As both curved sections merge into the common material section located between them, the lens body may have at least a lens center/main portion of full material.

The lens body may resemble a flattened doughnut, a horn torus, a torus without opening, a torus without continuous opening, a spindle torus and/or non-symmetrical hemispheres. These respective bodies all ensure that a common material section is provided into which both curved sections merge.

Generally, a torus can be defined parametrically by $$x(\theta,\varphi)=(R+r\cos\theta)\cos\varphi,$$

$$y(\theta,\varphi)=(R+r\cos\theta)\sin\varphi,$$

$$z(\theta,\varphi)=r\sin\theta,$$

where $\theta$, $\varphi$ are angles which make a full circle, so that their values start and end at the same point, R is the distance from the center of the tube to the center of the torus, r is the radius of the tube.

R is also known the major radius and r is known as the minor radius of the torus.

A horn torus is defined by R=r. Thus, both radii are similar. The torus has no hole or rather (continuous) opening.

A spindle torus is defined by R<r. The torus also does not have a hole or rather (continuous) opening.

According to another aspect, the antenna portions are spaced from each other over the entire axial length of the common material section. The axial direction corresponds to the propagation direction of the electromagnetic waves or rather the orientation of the antenna portion(s). Hence, the axial direction is (substantially) perpendicular to the aperture or rather the plane defined by the aperture. As the antenna portions are spaced from each other are distanced from each other over the entire axial length, a certain distance between them is provided at the axial beginning of the common material section and at the axial end of the common material section.

Put another way, the funnels provided by both curved sections, for example the lower one and the upper one, extend into the slot/space provided between the antenna portions.

According to an aspect, the antenna is a Vivaldi antenna. The Vivaldi antenna is also called a tapered slot antenna or an aperture antenna. Hence, the antenna is at least partly provided by a printed circuit board (PCB). The respective antenna portions are provided in a plane defined by the PCB. In some embodiments, conductive material strips may be provided that establish the antenna portions. Therefore, the distance between the antenna portions is also called slot. In some embodiments, the Vivaldi antenna is a simple planar antenna that is broadband (wide-band). Typically, the polarization may be linear.

According to another aspect, the antenna is a Horn antenna. The Horn antenna relates to a waveguide feed. Typically, the Horn antenna may have four antenna portions that define a space between them, which gradually increases towards the ends of the respective antenna portions. Thus, the distance gradually increases towards the ends of two opposite antenna portions.

Furthermore, the lens body may be rotationally non-symmetric. Hence, the first curved section and the second curved section may be different with respect to each other. Then, the lens center, namely the common material section of the lens body, may be different to the geometrical center of the lens body.

Another aspect provides that the lens body, in top view on the lens body, has an elliptical or circular shape. In other words, the outer edge of the lens body may be elliptical or rather circular.

According to another aspect, the lens body is made of a foam material. The foam material ensures that the lens body is light and merely indestructible, as the lens body can be compressed if necessary. Simultaneously, the lens body made of foam ensures that the antenna partly integrated is protected by the lens body.

Another aspect provides that the antenna portions comprise metal. In some embodiments, the antenna portions are made of metal. For instance, the antenna portions of a Horn antenna relate to metal sheets. In contrast, the antenna portions of a Vivaldi antenna or rather a tapered slot (line) antenna correspond to lines made of metal that are provided on the printed circuit board (PCB). In any case, the metal ensures high conductivity.

Moreover, the antenna system may have a half power beam width of more than 35 degrees, for example more than 50 degrees. The antenna is a wide-band antenna that is configured to process signals with frequencies up to 87 GHz. Simultaneously, the half power beam width (HPBW) is higher than 35 degrees, for example higher than 50 degrees, such that modern communication standards, for instance 5G or NR, can be measured with a compact antenna test range (CATR) comprising the respective antenna system.

Furthermore, the present disclosure provides a compact antenna test range that comprises an antenna system as described above. The advantages mentioned above apply to the compact antenna test range in a similar manner.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
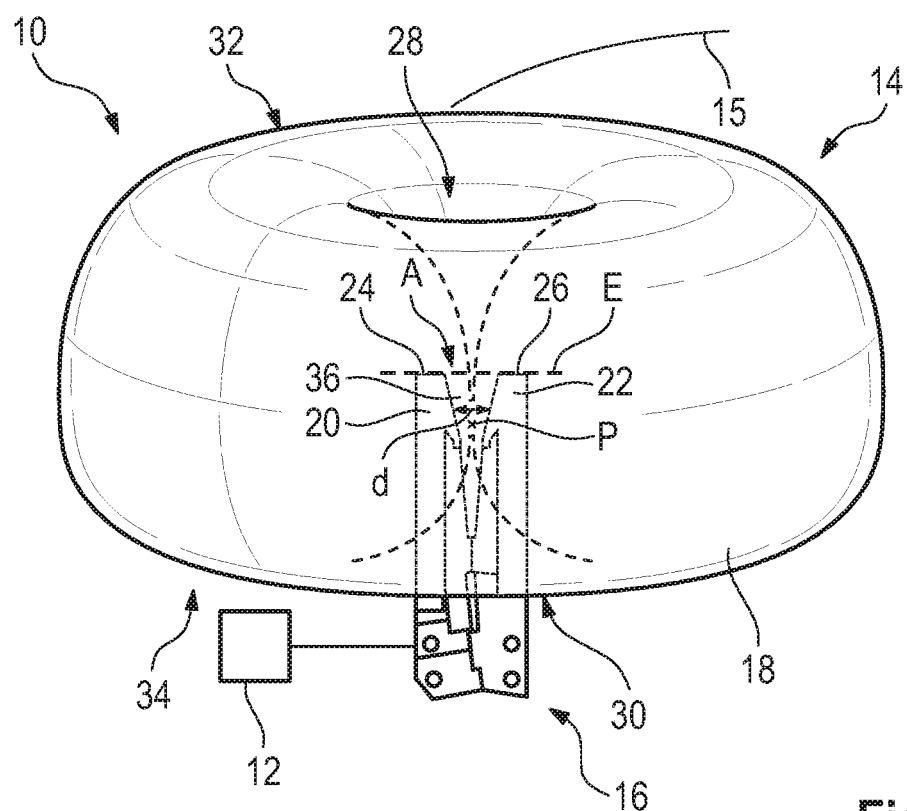
FIG. 1 illustrates a compact antenna test range according to the present disclosure, which comprises an antenna system according to the present disclosure.

In FIG. 1, a compact antenna test range 10 is shown that comprises a signal source 12 that is connected to an antenna system 14. The compact antenna test range 10 also comprises a reflector 15 that is assigned to the antenna system 14, as electromagnetic waves emitted by the antenna system 14 impinge on the reflector 15.

The antenna system 14 comprises a wide-band antenna 16 and a lens body 18 wherein the antenna 16 is partly located inside the lens body 18. In the shown embodiment, the wide-band antenna 16 relates to a Vivaldi antenna that is also called tapered slot (line) antenna.

The antenna 16 has a first antenna portion 20 as well as a second antenna portion 22 that are (substantially) symmetrical, but mirrored with respect to an axial center line of the antenna 16. The antenna portions 20, 22 each have an end 24, 26 that is assigned to the radiation direction of the antenna 16. The ends 24, 26 of the antenna portions 20, 22 together define the aperture A of the antenna 16. In some embodiments, the aperture A relates to the opening area of the antenna 16, which is defined by the area limited by the ends 24, 26. Generally, the ends 24, 26 are assigned to or orientated towards the radiation direction of the antenna 16.

Furthermore, the antenna portions 20, 22 are distanced from each other by a distance d that differs along the axial length of the antenna 16. As shown in FIG. 1, the antenna portions 20, 22 are shaped such that the distance d between the antenna portions 24 and 22 gradually increases towards the ends 24, 26. In some embodiments, the distance d is provided between two surfaces of the antenna portions 20, 22 that face each other.

The antenna portions 20, 22 of the antenna 16, namely the Vivaldi antenna, may comprise metal. In some embodiments, the antenna portions 20, 22 may be made of metal, as they are established by conductors that are provided on the printed circuit board (PCB). In some embodiments, the antenna portions 20, 22 are located in a common plane that is defined by the PCB.

As already mentioned, the antenna 16 is at least partly located inside the lens body 18. In some embodiments, a portion of the antenna 16 is placed inside the lens body 18, which comprise the antenna portions 20, 22 at least partly, for example completely.

In general, the lens body 18 has at least two curved sections 28, 30 that are assigned to an upper side 32 and a lower side 34 of the lens body 18, wherein the upper side 32 and the lower side 34 define opposite sides of the lens body 18. As shown in FIG. 1 as well as the cross sectional view of the lens body 18 shown in FIG. 3, the curved sections 28, 30 are funnel-shaped which means that the curved sections 28, 30 limit a funnel, namely a space formed as a truncated cone or rather a frustum of a cone. The narrower parts of the funnels, namely the truncated cones or rather frustums of a cone, are orientated towards each other.

In some embodiments, the curved sections 28, 30 merge into a common material section 36 of the lens body 18 such that the respective funnels, namely the spaces formed as truncated cones or rather frustums of a cone, are sealed or rather closed by the common material section 36. This is clearly shown in FIG. 3.

As shown in FIG. 1, the common material section 36 is located below the aperture A of the antenna 16 that is defined by the ends 24, 26 of the antenna portions 20, 22.

The common material section 36 may be regarded as a lens center of the lens body 18 that do not have to be equal to the geometrical center of the lens body, as the lens body 18 may be rotationally non-symmetric. However, the common material section 36 may relate to the core of the lens body 18 with which all other sections of the lens body 18 are connected.

In FIG. 1, it is also shown that the antenna 16 has a phase center P that is located within the common material section 36. Hence, the phase center P is located below the aperture A with respect to the radiation direction of the electromagnetic waves provided by the antenna 16. In other words, the common material section 36 is located in the area of the phase center P of the antenna 16.

The aperture A of the antenna 16 that is provided by the ends 24, 26 of the antenna portions 20, 22 defines a plane E that intersects one of both curved sections 28, 30, namely the upper curved section 28. In some embodiments, the plane E intersects the funnel or rather the truncated cone that is provided by the funnel-shaped curved section 28, as shown in FIG. 1. Hence, the antenna portions 20, 22 are spaced from each by the distance d that increases towards the ends 24, 26.

In the shown embodiment of FIG. 1, the antenna portions 20, 22 are already spaced from each other by distance d when they are located in a plane that intersects the lower curved section 30. As already mentioned, the antenna portions 20, 22 are still spaced from each other by distance d when they are located in a plane that intersects the upper curved section 28. In some embodiments, the distance d increases towards the ends 24, 26.

In other words, the antenna portions 20, 22 are spaced from each other over the entire axial length of the common material section 36, which is limited by the transitions of the curved sections 28, 30.

The lens body 18 may be made of a foam material such that the lens body 18 can be compressed. In addition, the lens body 18 protects the antenna 16 that is at least partly placed inside the lens body 18.

Figure 3:
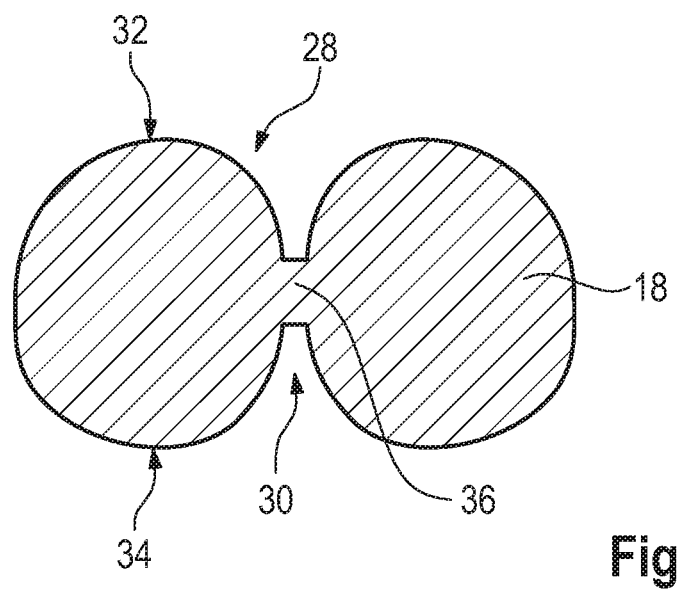
FIG. 3 schematically shows a cross-sectional view of a lens body used in FIG. 1.

As illustrated in FIGS. 1 and 3, the lens body 18 may have, in top view on the lens body 18, an elliptical or circular shape. The cross-sectional view shown in FIG. 3 already provides the information that the outer circumference of the lens body 18 may be curved such that the overall shape of the lens body 18 is an elliptical or circular one.

Figure 2:
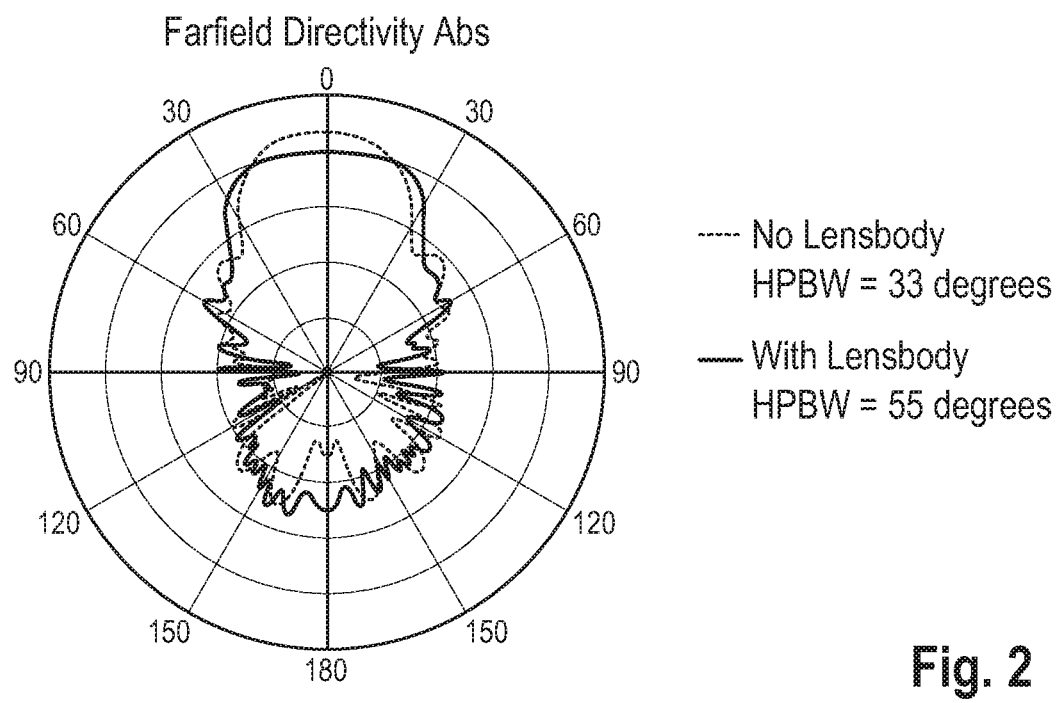
FIG. 2 illustrates radiation patterns of an antenna system according to the present disclosure.

In FIG. 2, the radiation pattern of the antenna system 14 shown in FIG. 1 is illustrated together with a radiation pattern of a similar antenna 16 without lens body 18.

In some embodiments, the half power beam width (HPBW) of the antenna system 14, namely the wide-band antenna 16 together with the lens body 18, is higher than 35 degrees. In some embodiments, the half power beam width is higher than 50 degrees, namely 55 degrees.

Figure 4:
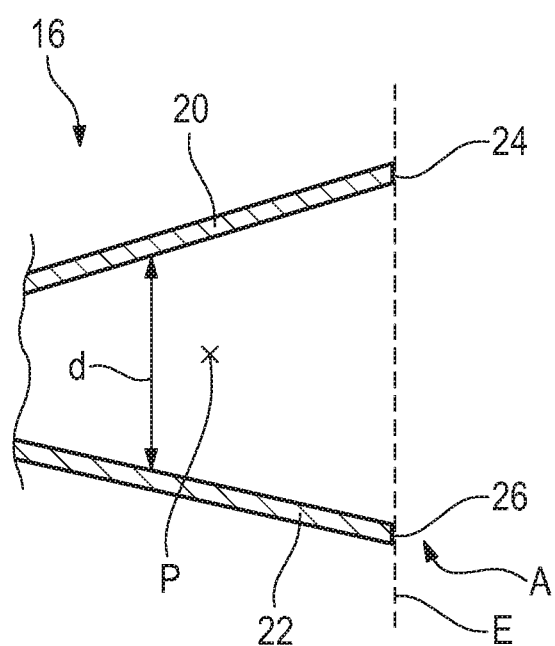
FIG. 4 schematically shows a cross-sectional view of an antenna of an antenna system according to another example of the present disclosure.

Alternatively to the Vivaldi antenna shown in FIG. 1, the antenna 16 may also be established by a Horn antenna that is schematically shown in FIG. 4.

The Horn antenna may comprise four antenna portions, namely a first and second one 20, 22 as well as a third and a fourth one. The first and the second antenna portion 20, 22 as well the third and the fourth one are pairwise located wherein they are located opposite to each other such that a space is limited by the four antenna portions.

In FIG. 4, only the antenna portions 20, 22 are shown as the antenna 16 is illustrated in a cross-sectional manner. However, the shape and structure of a Horn antenna is known.

Accordingly, the antenna portions 20, 22 may be established by metal sheets that define a room/space in which the phase center P may be located.

As shown in FIG. 4, the distance d between two opposite antenna portions 20, 22 increases gradually towards the respective ends 24, 26 of the antenna portions 20, 22, wherein the ends 24, 26 define the aperture A of the antenna 16.

Hence, the Horn antenna and the Vivaldi antenna are substantially similar with regard to their structure concerning the phase center P as well as the gradually increasing distance d towards the free ends 24, 26.

Accordingly, the Horn antenna shown in FIG. 4 can be used with the lens body 18 shown in FIGS. 1 and 3 in a similar manner Hence, the phase center P of the antenna 16 is also located in the common material section 36 of the lens body 18, as the antenna portions 20, 22 are spaced from each other over the entire axial length of the common material section 36.

Generally, the lens body 18 corresponds to a flattened doughnut, a horn torus, a torus without opening, a torus without continuous opening, a spindle torus and/or non-symmetrical hemispheres, as shown in FIGS. 1 and 3. In other words, the lens body 18 does not have a central opening or rather hole.

The phase center P of the antenna 16 is located within the lens center, namely the common material section 36. Thus, the radiation characteristics of the antenna system 14 is improved, for example the half power beam width (HPBW).

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An antenna system, the antenna system comprising a wide-band antenna and a lens body, at least a portion of the antenna being placed inside the lens body, the antenna having at least two antenna portions with ends, the antenna portions defining a distance between them, the distance gradually increasing towards the ends defining the aperture of the antenna, the lens body having at least two curved sections that merge into a common material section of the lens body, and the common material section being located below the aperture of the antenna, wherein each of both curved sections is funnel-shaped.

2. The antenna system according to claim 1, wherein the common material section corresponds to a lens center.

3. The antenna system according to claim 1, wherein the common material section is located in the area of a phase center of the antenna.

4. The antenna system according to claim 1, wherein at least one of both curved sections is funnel-shaped.

5. The antenna system according to claim 1, wherein the aperture of the antenna defines a plane that intersects one of both curved sections.

6. The antenna system according to claim 5, wherein the plane intersects a funnel provided by the funnel-shaped curved sections.

7. The antenna system according to claim 1, wherein the lens body resembles a flattened doughnut, a horn torus, a torus without opening, a torus without continuous opening, a spindle torus and/or non-symmetrical hemispheres.

8. The antenna system according to claim 1, wherein the antenna portions are spaced from each other over the entire axial length of the common material section.

9. The antenna system according to claim 1, wherein the antenna is a Vivaldi antenna.

10. The antenna system according to claim 1, wherein the antenna is a Horn antenna.

11. The antenna system according to claim 1, wherein the lens body is rotationally non-symmetric.

12. The antenna system according to claim 1, wherein the lens body, in top view on the lens body, has an elliptical or circular shape.

13. The antenna system according to claim 1, wherein the lens body is made of a foam material.

14. The antenna system according to claim 1, wherein the antenna portions comprise metal.

15. The antenna system according to claim 1, wherein the antenna portions are made of metal.

16. An antenna system, the antenna system comprising a wide-band antenna and a lens body, at least a portion of the antenna being placed inside the lens body, the antenna having at least two antenna portions with ends, the antenna portions defining a distance between them, the distance gradually increasing towards the ends defining the aperture of the antenna, the lens body having at least two curved sections that merge into a common material section of the lens body, and the common material section being located below the aperture of the antenna, wherein the antenna system has a half power beam width of more than 35 degrees.

17. The antenna system according to claim 1, wherein the antenna system has a half power beam width of more than 50 degrees.

18. A compact antenna test range, the compact test range with an antenna system, the antenna system comprising a wide-band antenna and a lens body, at least a portion of the antenna being placed inside the lens body, the antenna having at least two antenna portions with ends, the antenna portions defining a distance between them, the distance gradually increasing towards the ends defining the aperture of the antenna, the lens body having at least two curved sections that merge into a common material section of the lens body, and the common material section being located below the aperture of the antenna, wherein each of both curved sections is funnel-shaped.

* * * * *